(12) United States Patent
Banin et al.

(10) Patent No.: US 6,788,453 B2
(45) Date of Patent: Sep. 7, 2004

(54) METHOD FOR PRODUCING INORGANIC SEMICONDUCTOR NANOCRYSTALLINE RODS AND THEIR USE

(75) Inventors: Uri Banin, Mevasseret Zion (IL); Shi Hai Kan, Jerusalem (IL)

(73) Assignee: Yissum Research Development Company of the Hebrew Univeristy of Jerusalem, Jerusalem (IL)

( * ) Notice: Subject to any disclaimer, the term of this patent is extended or adjusted under 35 U.S.C. 154(b) by 71 days.

(21) Appl. No.: 10/144,777

(22) Filed: May 15, 2002

(65) Prior Publication Data

US 2003/0214699 A1 Nov. 20, 2003

(51) Int. Cl.[7] .................. H01S 3/00; H01L 21/00; H01L 33/00
(52) U.S. Cl. .................. 359/342; 438/48; 438/63; 257/E33.023
(58) Field of Search .................. 359/333, 342; 438/48, 63; 257/E33.023

(56) References Cited

U.S. PATENT DOCUMENTS

| | | | |
|---|---|---|---|
| 5,505,928 | A | 4/1996 | Alivisatos et al. |
| 6,179,912 | B1 | 1/2001 | Barbera-Guillem et al. |
| 6,225,198 | B1 | 5/2001 | Alivisatos et al. |
| 6,306,736 | B1 * | 10/2001 | Alivisatos et al. ........ 438/497 |
| 6,597,496 | B1 * | 7/2003 | Nayfeh et al. ........ 359/343 |
| 2002/0011564 | A1 | 1/2002 | Norris |

FOREIGN PATENT DOCUMENTS

| | | |
|---|---|---|
| WO | WO 01/07689 | 2/2001 |
| WO | 02/25745 A2 | 3/2002 |
| WO | WO 02/29140 | 4/2002 |

OTHER PUBLICATIONS

Wells, Richard L., et al. "Use of Tris(trimethylsilyl)arsine To Prepare Gallium Arsenide and Indium Arsenide." *Chemistry of Materials*. 1, pp. 4–6, 1989.

Guzelian, A.A., et al. "Colloidal chemical synthesis and characterization of InAs nanocrystal quantum dots." *Appl. Phys. Lett.* 69(10), pp. 1432–1434, Sep. 2, 1996.

(List continued on next page.)

*Primary Examiner*—Mark Hellner
(74) *Attorney, Agent, or Firm*—Nath & Associates PLLC; Gary M. Nath; Lee C. Heiman

(57) ABSTRACT

The present invention provides a new method for the production of inorganic semiconductor nanocrystals having a rod-like shape. More specifically the present invention provides a method of synthesizing rod shaped Group III–V semiconductor nanocrystals. The method comprises: reacting, in a high-boiling point organic solvent, a two-source precursor solution comprising at least one metal source and at least one nonmetal source, or a single-source precursor solution, with a metal catalyst or an agent capable of producing said metal catalyst, said high-boiling point organic solvent having a temperature above 200° C., thereby forming a reaction product comprising semiconductor nanocrystals of various shape; cooling the reaction product, and subsequently exposing said cooled reaction product to at least one centrifugal step so as to obtain semiconductor nanocrystals having substantially rod-like shape.

The rod-shaped nanocrystals obtained by the method of the invention usually have organic ligands as a coating on their outer surfaces. Such organic ligands affect the solubility of the particles and may be substituted or removed, according to the application intended for said particles after the reaction is completed.

37 Claims, 6 Drawing Sheets

OTHER PUBLICATIONS

Wagner, R.S. "VLS Mechanism of Crystal Growth" in *Whisker Technology* ed. A.P. Levitt.

Morales, A.M., et al. "A Laser Ablation Method for the Synthesis of Crystalline Semiconductor Nanowires." *Science*. vol. 279, pp. 208–211, Jan. 9, 1998.

Duan, Xiangfeng, et al. "General Synthesis of Compound Semiconductor Nanowires." *Adv. Matter*. vol. 12, No. 4, pp. 298–302, 2000.

Cui, Yi, et al. "Doping and Electrical Transport in Silicon Nanowires." The Journal of Physical Chemistry. vol. 104, No. 22, pp. 5213–5216, May 11, 2000.

Gudiksen, Mark S., et al. "Growth of nanowire superlattice structures for nanoscale photonics and electronics." *Nature*. vol. 415, pp. 617–620, Feb. 2002.

Gudiksen, Mark S., et al., "Synthetic Control of the Diameter and Length of a Single Crystal Semiconductor Nanowires." *J. Phys. Chem.* 105, pp. 4062–4064, 2001.

Wang, Jianfang, et al. "Highly Polarized Photoluminescence and Photodetection from Single Indium Phosphide Nanowires." *Science*. vol. 293, pp. 1455–1457, Aug. 24, 2001.

Huang, Yu, et al. "Logic Gates and Computation from Assembled Nanowire Building Blocks." *Science*. vol. 294, pp. 1313–1317, Nov. 9, 2001.

Holmes, Justin D., et al. "Control of Thickness and Orientation of Solution–Grown Silicon Nanowires." *Science*. vol. 287, pp. 1471–1473, Feb. 25, 2000.

Hu, Jiangtao, et al. "Linearly Polarized Emission from Colloidal Semiconductor Quantum Rods." *Science*. vol. 292, pp. 2060–2063, Jun. 15, 2001.

Kazes, Miri, et al. "Lasing from Semiconductor Quantum Rods in a Cylindrical Microcavity." *Adv. Matter*. Vo. 14, No. 4, pp. 317–321, Feb. 19, 2002.

Huang, Yu, et al. "Directed Assembly of One–Dimensional Nanostructures into Functional Networks." *Science*. vol. 291, pp. 630–633, Jan. 26, 2001.

Peng, Xiaogang, et al. "Shape control of CdSe nanocrystals." *Nature*. vol. 404, pp. 59–61, Mar. 2000.

Cao, YunWei, et al. "Growth and Properties of Semiconductor Core/Shell Nanocrystals with InAs Cores." *J. Am. Chem. Soc.*, 122, pp. 9692–9702, 2000.

Trentler, Timothy, et al. "Solution–Liquid–Solid Growth of Indium Phosphide Fibers from Organometallic Precursors: Elucidation of Molecular and Nonmolecular Components of the Pathway." *J. Am. Chem. Soc.*, 119, pp. 2172–2181, 1997.

Brust, Mathias, et al. "Synthesis of Thiol–derivatised Gold Nanoparticals in a Two–phase Liquid–Liquid System." *J. Chem. Soc.*, Chem. Commun. pp. 801–802, 1994.

Trentler, Timothy J., et al., "Solution–Liquid–Solid Growth of Indium Phosphide Fibers from Organometallic Precursors: Elucidation of Molecular and Nonmolecular Components of the Pathway". J. Am. Chem. Soc., vol. 119, pp. 2172–2181, 1997.

* cited by examiner

METHOD FOR PRODUCING INORGANIC SEMICONDUCTOR NANOCRYSTALLINE RODS AND THEIR USE

FIELD OF THE INVENTION

This invention relates to a method for synthesizing rod-shaped semiconductor nanocrystals, inter alia rod shaped Group III–V semiconductor nanocrystals.

LIST OF REFERENCES

The following references are considered to be pertinent for the purpose of understanding the background of the present invention:
1. R. L. Wells et al., *Chem. Mater.* 1, 4 (1989).
2. A. P. Alivisatos and M. A. Olshavsky, U.S. Pat. No. 5,505,928.
3. A. A. Guzelian, U. Banin, A. V. Kadavanich, X. Peng, A. P. Alivisatos, *Appl. Phys. Lett.* 69, 1432 (1996).
4. R. S. Wagner, in *Whisker Technology*, A. P. Levitt, Ed. (Wiley-Interscience, New York, 1970), pp.47–119.
5. A. M. Morales, and C. M. Lieber, *Science* 279, 208 (1998).
6. X. F. Duan, and C. M. Lieber, *Adv. Mater.* 12, 298 (2000).
7. Y. Cui, X. F. Duan, J. T. Hu, C. M. Lieber, *J. Phys. Chem. B* 104, 5213 (2000).
8. M. S. Gudiksen, L. J. Lauhon, J. F. Wang, D. C. Smith, C. M. Lieber, *Nature* 415, 617 (2002).
9. Gudiksen, J. F. Wang, C. M. Lieber, *J. Phys. Chem. B* 105, 4062 (2001).
10. J. F. Wang, M. S. Gudiksen, X. F. Duan, Y Cui, C. M. Lieber, *Science* 293, 1455 (2001).
11. Y. Huang, X. F. Duan, Y. Cui, L. J. Lauhon, K. H. Jim, C. M. Lieber, *Science* 294, 1313 (2001).
12. J. D. Holmes, K. P. Johnston, R. C. Doty, B. A. Korgel, *Science* 287, 1471 (2000).
13. J. T. Hu, L. S. Li, W. D. Yang, L. Manna, L. W. Wang, A. P. Alivisatos, *Science* 292, 2060 (2001).
14. M. Kazes, D. Lewis, Y. Ebenstein, T. Mokari, U. Banin, *Adv. Mater.* 14, 317 (2002).
15. Y Huang, X. F. Duan, Q. Q. Wei, C. M. Lieber, *Science* 291, 630 (2001).
16. X. G Peng, L. Manna, W. D. Yang, J. Wickham, E. Scher, A. Kadavanich, A. P. Alivisatos, *Nature* 404, 59 (2000).
17. A. P. Alivisatos et al., U.S. Pat. No. 6,225,198.
18. A. P. Alivisatos et al., U.S. Pat, No. 6,306,736.
19. U. Banin and Y. W. Cao, PCT Application WO 02/25745.
20. Y. W. Cao, and U. Banin, *J. Am. Chem. Soc.* 122, 9692 (2000).
21. T. J. Trentler, S. C. Geol, K. M. Hickman, A. M. Viano, M. Y. Chiang, A. M. Beatty, P. C. Gibbons, W. E. Buhro, *J. Am. Chem. Soc.* 119, 2172 (1997).
22. M. Brust et al., *J. Chem. Soc. Chem. Commun.* 801 (1994).

BACKGROUND OF THE INVENTION

Miniaturization of electronic and optical devices requires semiconductors of nanometer size domain. Inorganic semiconductors, in particular Group III–V semiconductors, exhibit features that make them attractive for use in solid state electronics as well as optical devices (e.g., high thermal stability, high electron mobility, low energy band gap, and direct-band gap behavior.

Developing preparation methods of semiconductor nanocrystals has been an important branch of synthetic chemistry. For many of the semiconductors, syntheses through the reaction of simple reactants have been proved to be impossible, thus only until recent years, some of them can be prepared through the use of organometallic precursors in organic solvents. The typical examples are Group III–V semiconductor nanocrystals, which are formed by dissolving a Group IIIa precursor and a Group Va precursor in a solvent and then applying heat to the obtained mixture of solvent and precursors. More specifically, Group III–V semiconductor nanocrystals may be produced by using silyl cleavage. Specifically, Group III halides have been reacted with $E(SiMe_3)_3$, where E=P,As, in hydrocarbon solvents to yield nanocrystalline III–V semiconductors [1].

Alivisatos et al. [2] described a process for forming Group III–V semiconductor nanocrystals wherein size control is achieved through the use of a crystallite growth terminator such as nitrogen- or phosphorus-containing polar organic solvent, for example pyridine, quinoline or mono-, di-, and tri-($C_{1-6}$ alkyl)phosphines.

High quality group III–V semiconductor nanocrystals were produced by a method consisting of injecting the precursors into a hot coordinating solvent such as trioctylphosphine (TOP) [3].

All the above-mentioned processes can yield only spherically shaped nanocrystal semiconductors (also termed quantum dots) of the group III–V.

In the nanometer size domain the properties of semiconductors depend not only on size but also on shape. The growth of crystalline wire-like structures based on the vapor-liquid-solid (VLS) mechanism has been developed [4]. In the VLS method, a liquid metal cluster acts as a catalyst where the gas-phase reactants adsorb, subsequently leading to whisker growth from the supersaturated drop. Laser ablation was combined to form nanometer-sized metal clusters as catalysts with the VLS mechanism, to grow a variety of semiconductor nanowires, doped nanowires, and nanowire superlattices with lengths in the micrometer range [5–8]. The diameters of the nanowires could be tuned by changing the size of the catalyst clusters [9] and for silicon nanowires, the smallest diameter reported was 6 nm. For InAs and other III–V semiconductor nanowires, the average diameters are larger than 10 nm. Such diameters are at the onset of the strong quantum confinement regime providing rather limited band gap tunability by size effects. A whole set of optoelectronic devices including transistors, detectors and a light emitting diode were demonstrated using these nanowire building blocks [10, 11]. Micron long silicon nanowires with diameters of 4–5 nm were also prepared in a pressurized solution system by using gold nanocrystals as catalyst [12].

Rod-shaped nanocrystals are interesting because the rod shape produces polarized light emission leading to polarized lasing [13, 14]. Additionally, rod-shaped particles are suitable for integration into nano-electrode structures for the production of electronic devices such as sensors, transistors, detectors, and ligh-temitting diodes [11, 15]. A recent example of rod-shhaped nanocrystals was described in relation with CdSe nanocrystals [16, 17]. Shape control in this case was realized by kinetically controlled growth along the special c-axis of wurtzite CdSe nanocrystals through the use of a mixture of surfactants. Such a process is not applicable for the growth of cubic-structured semiconductor nanorods, e.g. nanorods of a few important III–V semiconductors. Therefore a novel and completely different rod growth mechanism is needed for these compounds.

A process for the formation of shaped Group III–V semiconductor nanocrystals is described in U.S. Pat. No.

6,306,736 [18], according to which a solution of the semiconductor nanocrystal precursors was contacted with a liquid media comprising a binary surfactant mixture capable of promoting the growth of either spherical semiconductor nanocrystals or rod-like semiconductor nanocrystals.

SUMMARY OF THE INVENTION

There is a need in the art to facilitate preparation of nanocrystalline semiconductors, especially Group III–V semiconductors, having rod-like shape of controlled dimensions in a controllable and repeatable manner, which are not available to date. The term "III–V semiconductor" is used to describe crystalline material or solid solution formed from the reaction of at least one metal precursor from group IIIa of the Periodic Table of the Elements (B, Al, Ga, In, and Tl) and at least one element from group Va of the Periodic Table of the Elements (N, P, As, Sb, and Bi). It should be noted here that the expression "at least one" is used in recognition of the fact that, for example, a particular Group IIIa metal precursor may be reacted with more than one particular Group Va precursor, e.g., GaAsP, and vice versa, e.g. InGaAs.

The term "nanocrystal having rod-like shape" or "nanorod" is meant a nanocrystal with extended growth along the first axis of the crystal while maintaining the very small dimensions of the other two axes, resulting in the growth of a rod-like shaped semiconductor nanocrystal of very small diameter, where the dimensions along the first axis may range from about 10 nm to about 500 nm. The nanorods prepared by the method of the invention may have one end made of non semiconducting material.

Examples of Group III–V semiconductors that may be prepared by the method of the invention are InAs, GaAs, GaP, GaSb, InP, InSb, AlAs, AlP, AlSb and alloys such as InGaAs, GaAsP, InAsP. Examples of Group II–VI semiconductors that may be prepared by the method of the invention are CdS, CdSe, CdTe, ZnS, ZnSe, ZnTe, HgS, HgSe, HgTe and the like. Examples of Group I–VII semiconductors are CuCl, CuBr, CuI, AgCl, AgBr, AgI and the like.

The main idea of the present invention is based on introducing nanoparticles of a metal catalyst that serve as starting nanocrystals from which nanorods of inorganic semiconductors grow. Without being bound to theory, it is proposed that the reaction precursors dissolve in the metal nanoparticles and the semiconductor nanorods grow from these particles.

The metal catalyst can be for example a noble metal, e.g. gold, a Group IIIb metal, e.g. In, Ga, Al or a transition metal, e.g. Fe, Zn, Cd, etc. The catalyst nanoparticles may either be formed in-situ in the reaction process from one of the precursor materials by using a reducing agent or be added to the reaction process.

Thus, in one aspect the present invention provides a new method for the production of inorganic semiconductor nanocrystals having a rod-like shape, the method comprising:

reacting, in a high-boiling point organic solvent, a two-source precursor solution comprising at least one metal source and at least one nonmetal source, or a precursor solution comprising a single-source precursor, with a metal catalyst or an agent capable of producing said metal catalyst, said high-boiling point organic solvent having a temperature above 200° C., thereby forming a reaction product comprising semiconductor nanocrystals of various shape;

cooling the reaction product, and subsequently exposing said cooled reaction product to at least one centrifugal step so as to obtain semiconductor nanocrystals having substantially rod-like shape.

The rod-shaped nanocrystals obtained by the method of the invention usually have organic ligands as a coating on their outer surfaces. Such organic ligands affect the solubility of the particles and may be substituted or removed, according to the application intended for said particles after the reaction is completed.

The reaction precursors used in the method of the invention are selected from Group Ib, IIb or IIIa metal compounds, Group VIIa, VIa or Va non-metal compounds, Group IV element compounds, compounds comprising both Group Ib and Group VIIa elements, compounds comprising both Group IIb and Group VIa elements and compounds comprising both Group IIIa and Group Va elements. Consequently, the inorganic semiconductor rods prepared by the method of the invention are selected from Group III–V, Group III–V alloys, Group II–VI, Group I–VII, and Group IV semiconductors.

Examples for single-source precursor compounds, e.g. for Group III–V semiconductors: $\{t\text{-}Bu_2In[\mu\text{-}P(SiMe_3)_2]\}_2$, $[t\text{-}Bu_2In(\mu\text{-}PH2)]_3$; for Group IV semiconductors: $(C_6H_5)_2SiH_2)$.

According to a preferred embodiment, the present invention provides a method for the formation of Group III–V semiconductor nanocrystals having rod-like shape, comprising (i) reacting, in a high-boiling point organic solvent, a precursor solution comprising at least one Group IIIa metal source and at least one Group Va nonmetal source with a metal catalyst or an agent capable of producing said metal catalyst, said high-boiling point organic solvent having a temperature above 200° C., thereby forming a reaction product comprising Group III–V nanocrystals of various shape;

(ii) cooling the reaction product, and (iii) subsequently exposing said cooled reaction product to at least one centrifugal step so as to obtain Group III–V semiconductor nanocrystals having substantially rod-like shape.

Preferably, the metal catalyst is produced in situ by using an agent capable of producing it, for example by using a reducing agent capable of reducing the Group IIIa metal precursor into the corresponding Group IIIa metal.

According to another preferred embodiment, the present invention provides a method for the production of InAs semiconductor nanocrystals having rod-like shape, comprising introducing a precursor solution of an In source and an As source into a high-boiling point organic solvent comprising $NaBH_4$, said high-boiling point organic solvent having a temperature above 200° C., thereby forming upon cooling and optionally annealing a reaction product comprising InAs nanocrystals of various shape, and subsequently carrying out at least one centrifugal step so as to obtain InAs semiconductor nanocrystals having rod-like shape.

Semiconductor nanocrystals having rod-like shape and formed by the above-described method present another aspect of the present invention.

Semiconductor nanocrystals are of interest for use in optical displays, optical detectors, data communication systems and biological applications such as fluorescence marking of biomolecules, and as sensors. Rod/shell nanocrystals based on the nanorods prepared by the method of the invention may provide further control of the optical and electronic properties of the nanorods specifically as a method to enhance their fluorescence efficiency that is important for various applications [19, 20].

BRIEF DESCRIPTION OF THE DRAWINGS

In order to understand the invention and to see how it may be carried out in practice, preferred embodiment will now be described, by way of non-limiting example and with reference to the accompanying drawings, in which:

FIG. 2A shows sample before separation, FIGS. 2B and 2C show the first and second fractions, respectively, from a synthesis without annealing, and FIG. 2D shows—indium nanoparticles;

DETAILED DESCRIPTION OF THE INVENTION

The method of the present invention affords the formation of nanorods of inorganic semiconductors with controlled diameters and lengths. The method is exemplified hereinbelow with reference to the preparation of InAs nanocrystal rods, which belong to the important Group IIIa–Va semiconductors. While this is a preferred embodiment, the method of the invention can be used to make any of the inorganic semiconductor nanocrystals in rod shape. Examples for Group III–V semiconductors are GaAs, GaP, GaSb, InP, InSb, AlAs, AlP, AlSb and alloys such as InGaAs, GaAsP, InAsP, etc.; examples for Group II–VI semiconductors are CdS, CdSe, CdTe, ZnS, ZnSe, ZnTe, HgS, HgSe, HgTe, etc.; examples for Group I–VII semiconductors are CuCl, CuBr, CuI, AgCl, AgBr, AgI, etc.; and examples for Group IV semiconductors are Si and Ge.

The method of the invention is carried out in a reaction medium free of air and water. The two-source precursor reactants, i.e. the source for the metal part and the source for the nonmetal part of the semiconductors, are combined in a ratio of metal source:nonmetal source ranging from 1:1 to about 3:1. The concentrations of both the two-source- or single-source precursors are in the range of 0.01–0.5 M. The reaction requires an elevated temperature, of at least 200° C. The solvents used in the method are high boiling point organic solvents, for example phosphines such as trioctylphosphine (TOP), trioctylphosphine oxide (TOPO), triphenylphosphine (TPP), triphenylphosphine-oxide (TPPO), or amines such as hexadecyl amine (HDA) or dodecylamine (DDA) or other strongly coordinating high boiling point solvents. When the reaction is carried out in trioctylphosphine oxide, for example, the reaction is carried out at about 360° C.

The duration of the reaction depends on the reaction temperature and pressure. For example, the reaction may be completed within periods of from about a few seconds to a few hours. When it is carried out at 300–360° C. and at a pressure higher than normal pressure, for example 100 bar, the reaction duration is shortened.

The reaction is stopped by cooling the reaction mixture (also called growth solution) to room temperature and diluting the growth solution with a hydrocarbon solvent such as toluene. In an optional step, the growth solution is annealed at a temperature up to about 360° C. for a period of between a few minutes to a few hours. Centrifugation is then used to purify the rods and separate them from other reaction products and from the growth medium, resulting in nanorods with a uniform diameters of about 3–4 nm and a length from about 10 nm to about 500 nm.

Figure 1:
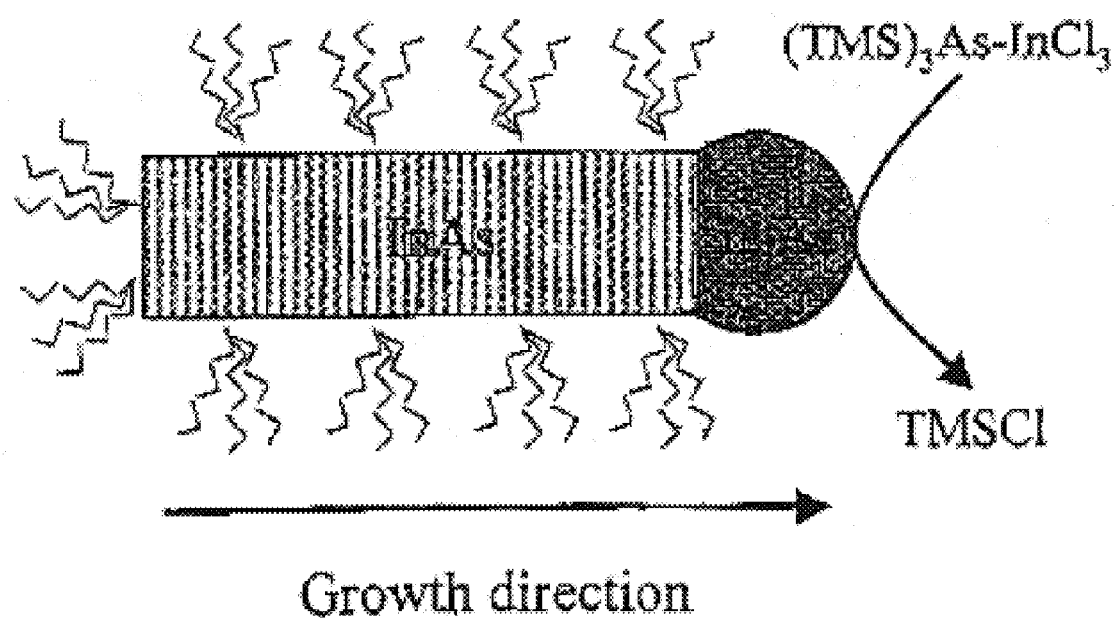
FIG. 1 is a schematic illustration of the growth mechanism of InAs nanorods according to the invention.

Thus, in a specific example, InAs nanorods were synthesized via the reaction of tris(trimethylsilyl)arsenine ($(TMS)_3As$) and $InCl_3$ in trioctylphosphine-oxide (TOPO). FIG. 1 shows a schematic illustration of the growth mechanism of InAs nanorods. The metallic catalyst, namely indium, forms a starting nanocrystal from which the semiconductor nanorod grows, the growing direction shown in the figure signifying that the left end portion of the rod was grown first and then "moved" away from the metallic catalyst during the continuous growth of the nanorod.

A reducing agent, for example $NaBH_4$, is added to in-situ create metallic indium nanodroplets that direct the one-dimensional rod growth via a solutionliquid-solid mechanism (hereinafter "SLS mechanism"). The SLS mechanism was first used in the growth of polycrystalline whiskers of III–V semiconductors reported by Buhro and coworkers [21]. The so-grown whiskers had diameters in the range of 10–150 nm and lengths of a few micrometers. In our example, the in-situ formed indium nanodroplets are much smaller than the indium droplets used in Buhro's method. These nanodroplets are mostly consumed during the nanorod growth, thus the length of the as-prepared nanorods is confined. In addition, we can control the growth effectively by controlling the reaction time. Additionally, several separation stages were introduced to obtain rods of desired length. The reactions are carried out in coordinating solvents leading to soluble rods and the reaction temperature is relatively high resulting in crystalline rods.

The reaction route in the above example can be described as follows:

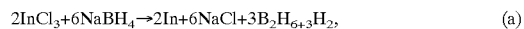

$$2InCl_3 + 6NaBH_4 \rightarrow 2In + 6NaCl + 3B_2H_{6+3}H_2, \quad (a)$$

$$(b) \; InCl_3 + As(SiMe_3)_3 \rightarrow InAs + 3Me_3SiCl, \quad (b)$$

The SLS mechanism requires the addition or the in-situ formation of a metal nanoparticle as a catalyst for rod growth. In the case of in-situ formation, $InCl_3$ is reduced by $NaBH_4$ to form metallic indium nanodroplets that direct the one-dimensional rod growth. As these indium nanodroplets are formed, the precursors that are in the immediate vicinity react and allow for immediate growth of the rods effectively competing with further growth of the droplets. In this way, narrow rod diameters may be achieved.

In a typical experiment conducted in an air-free system, 20 mg $NaBH_4$ and 3 g TOPO were put in a 3-neck flask. A stock solution, containing 0.8 mmol $(TMS)_3As$ and 1.6 mmol $InCl_3$/trioctylphosphine (TOP) solution (0.3 g/ml), was diluted with 0.5 g TOP. The stock solution was injected at 340° C. into the $NaBH_4$/TOPO solution under vigorous stirring, followed either by quenching or by annealing at 300° C. for a few minutes. The process yields InAs nanorods with a uniform diameter but broad length distribution along with byproducts.

Figures 2A, 2B:
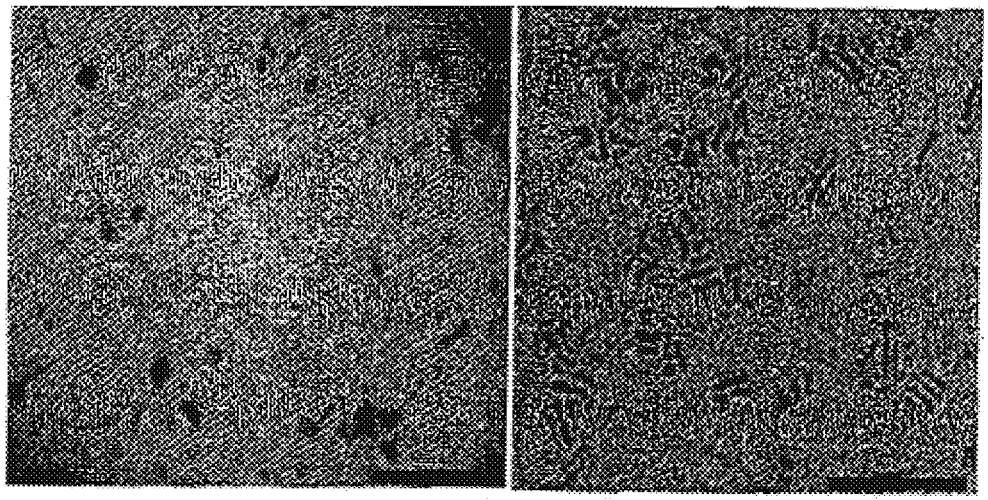
FIGS. 2A to 2D illustrate TEM images showing a separation stage of the method of the invention and TEM of indium nanoparticles.
Figure 3:
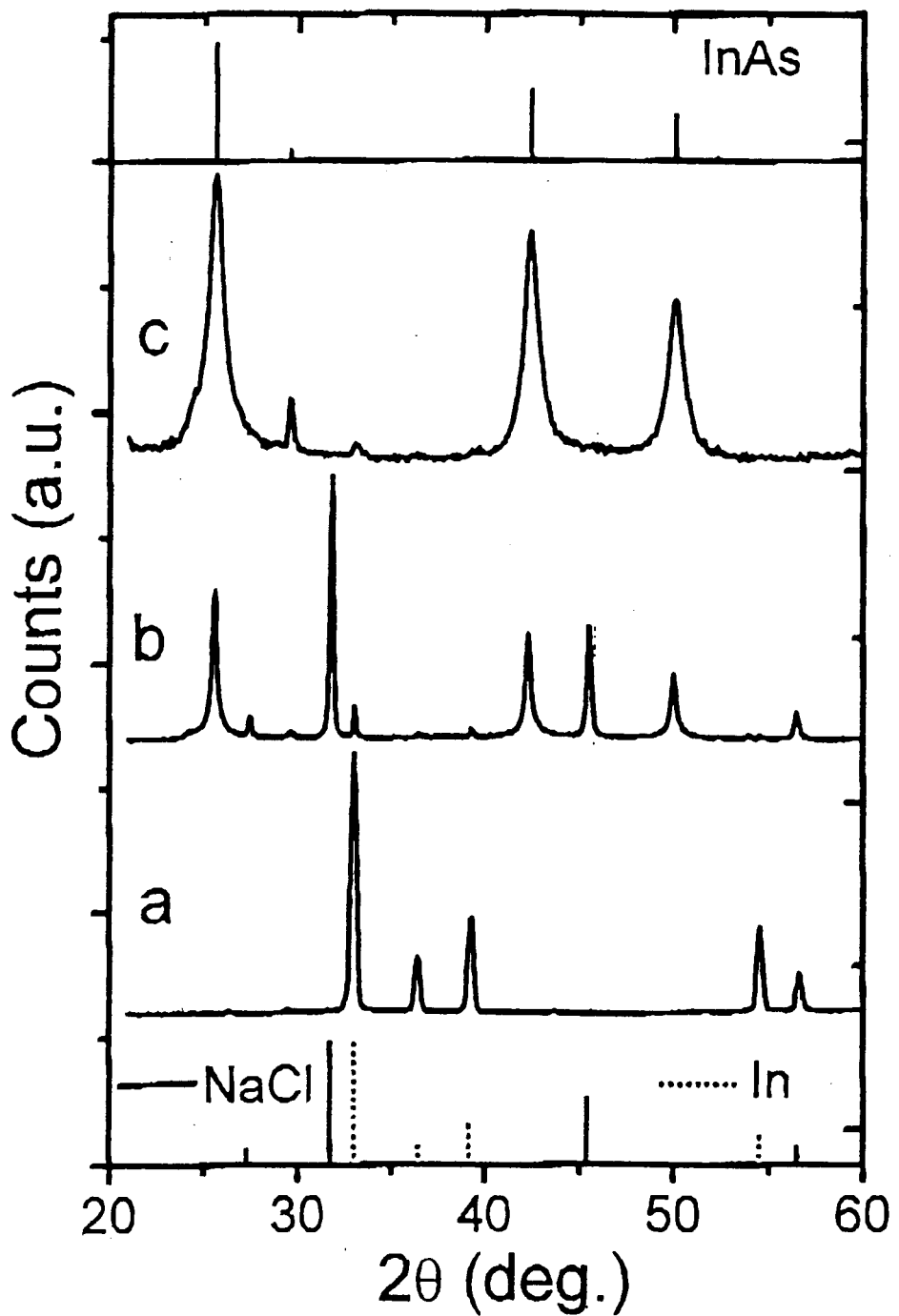
FIG. 3 illustrates the powder XRD patterns of indium nanodroplets of FIG. 2D, of the precipitate from the first step of separation, as shown in FIG. 2A, and rods from the second step of separation, as shown in FIG. 2B (the diffraction peak structure for metallic indium and for NaCl being indicated in the bottom of the figure, while the peaks for InAs being shown in the top)

FIG. 2A illustrates a TEM image of the reaction products showing a distribution of dots, rods and larger particles. The image was obtained with a Philips CM 120 microscope operated at 100 keV The powder X-ray diffraction pattern of the reaction products is shown as graph b in FIG. 3. The pattern was determined using the Philips PW1830/40 X-ray diffractometer operated at 40 kV and 30 mA with Cu $K_\alpha$ radiation. As shown, peaks of InAs, metallic indium, and NaCl can be identified. The reaction produces a mixture of InAs dots, InAs rods, big InAs crystals, Indium nanocrystals and NaCl particles. The larger particles dominate the XRD signal and the peaks are therefore rather narrow.

Figures 2C, 2D:
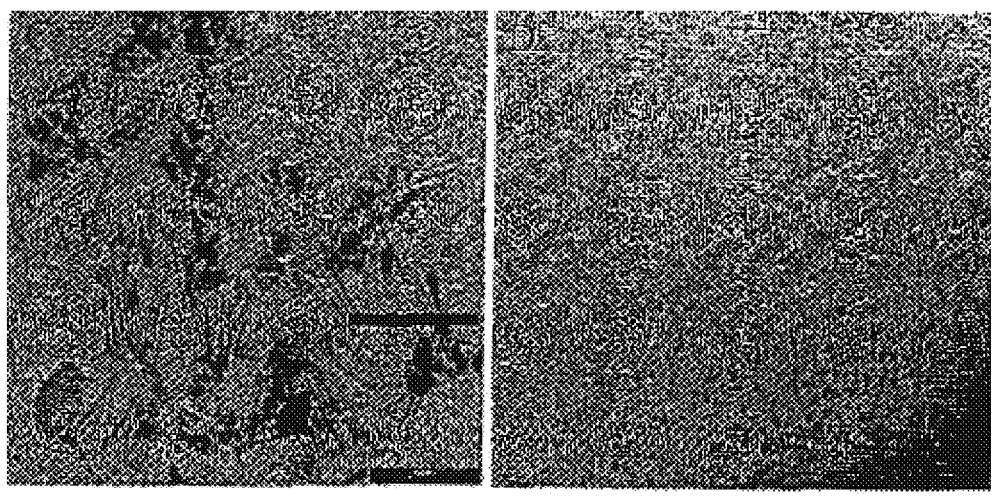

The rods were purified and size-selected by centrifugation. The raw product was diluted with toluene and centrifuged at 6000 rpm (rcf-relative centrifugal force ~4000 g) for 20 min. Under this condition, rods are precipitated together with other big particles while the dots remain soluble. This step was repeated to achieve thorough separation of dots. In the second step, rods were obtained. The precipitate was re-dispersed by ultrasonication in toluene with TOPO added to stabilize the solution. Then, the solution was centrifuged at 4000 rpm (rcf ~1800 g) for 10 min, and the supernatant contained a fraction of nanorods with an average length of about 25 nm and diameter of 3–4 nm. This is illustrated in FIG. 2B showing the image obtained with the Philips CM 120 microscope (100 keV). The XRD pattern of the separated rods is shown as graph c in FIG. 3. After separation, only InAs peaks and trace amount of indium are detected. The peaks are broadened because of the nanosized diameter of the rods. A fraction of longer nanorods (mean length of about 60 nm) was obtained from the precipitate by repeating the separation step (second separation) using a centrifugal speed of 3000 rpm (rcf ~1000 g) for 10 min. The results are shown in FIG. 2C. The rods are uniform in diameter with broader length distribution. Further separation and re-precipitation steps can be used to improve the uniformity. The corresponding XRD pattern is similar to graph c in FIG. 3.

Figures 4A, 4B, 4C, 4D:
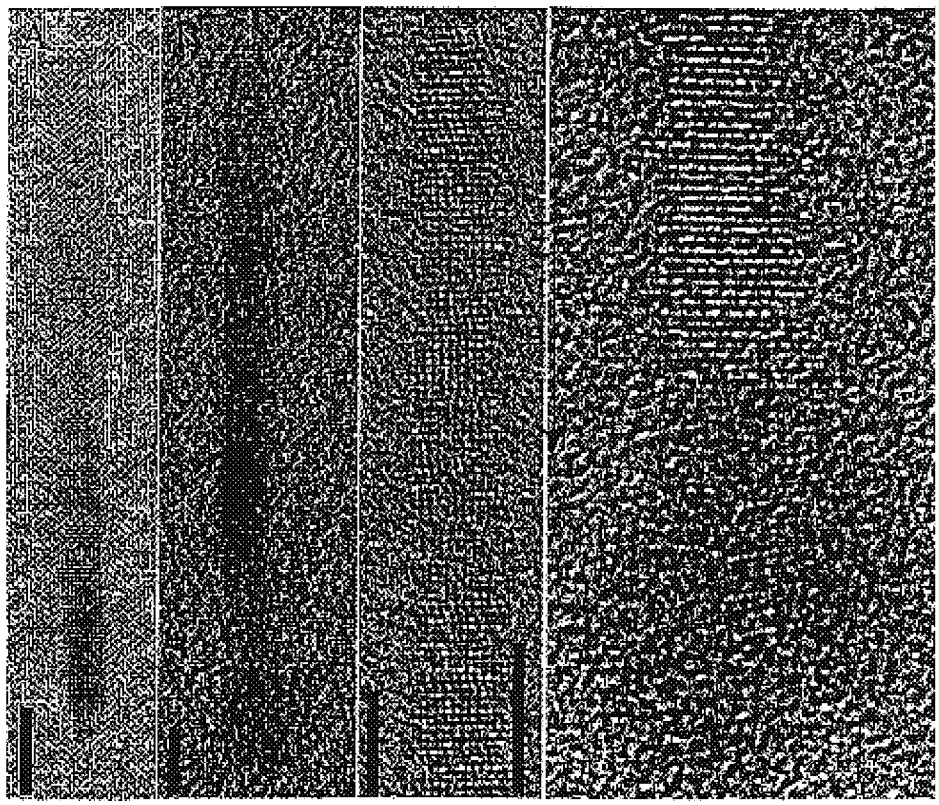
FIG. 4A illustrates high magnification TEM images of a single InAs nanorod; (B)–(D) illustrate high resolution TEM images of crystalline InAs nanorods.

TEM images of individual nanorods are shown in FIG. 4. Here, A is the image of a rod observed under high magnification. B, C and D are high-resolution TEM images of the crystalline nanorods, wherein B is the image of a full rod with a diameter of about 3 nm and length of about 50 nm, C is the image of a part of a rod with a diameter of about 3.5 nm and length about 50 nm, and D is the image of an end part of a rod with a diameter of about 4 nm (scale bars, 5 nm). Nanorods are rather uniform in diameter and have one sharpened end considered as the starting point of the rod growth (image C). Cross lattice fringes are resolved. The growth occurs along the InAs [111] plane. Measured distance between neighboring planes are 3.46 Angstrom, close to the d value for InAs [111] planes (3.5 Angstrom). Stacking faults are also resolved. For some rods the inventors detected a spherical particle in one end, with diameter larger than the mean nanorod diameter (image D). Although this particle is too small for chemical analysis, it is suggested that it is mainly composed of indium. This interpretation gains support from energy dispersive X-ray spectroscopy (EDS) analysis performed in the TEM on an area with many rods, yielding 56% In and 44% As (molar ratio). This result is consistent with EDS result for a full fraction of rods measured using microprobe analysis. This In/As ratio is higher than that in a typical sample of InAs nanodots (51% In over 49% As), indicating the existence of metallic indium, as also demonstrated in the XRD result.

The reduction process was studied by injecting an $InCl_3$/TOP solution at 340° C., followed by rapid cooling to quench the reaction. Indium nanoparticles with a broad size distribution from a few nanometers to about 20 nm were obtained as shown in FIG. 2D. The size of the droplets is much larger than the average diameter of the rods because even in the presence of a surfactant, the indium droplets grow rapidly at 340° C., a temperature much higher than the melting point of indium metal.

In the method of the invention, both TOP and TOPO can be used as solvents, but TOPO has a higher boiling point than TOP (360 vs 300° C.), and thus enables a higher reaction temperature. Obviously, the higher reaction temperature leads to better crystallinity of the products. For the growth of rods there is a further advantage in the higher temperature condition as the yield of rod production is higher.

In order to optimize the synthesis conditions, the effect of the ratio between the precursors and the reducing agent was studied. This ratio, marked as P, was calculated as the molar ratio between arsenic and the upper limit of metallic indium calculated from the amount of reduction agent. The inventors studied syntheses with P ranging from 1 to 9. In TOP, since the reaction temperature is lower, annealing was needed for rod growth. In this condition, nanorods were obtained when P was as high as 9 although a large fraction of the rods were kinked and their yield was low. TOPO provided higher temperatures, under which rods formed immediately upon injection of precursors. The short reaction time means that growth of large indium nanodroplets can be mostly avoided, enabling the use of a lower ratio that results in a higher yield of rods. It was found that a ratio P of 4.5 is optimal in a typical synthesis conditions.

Figure 5:
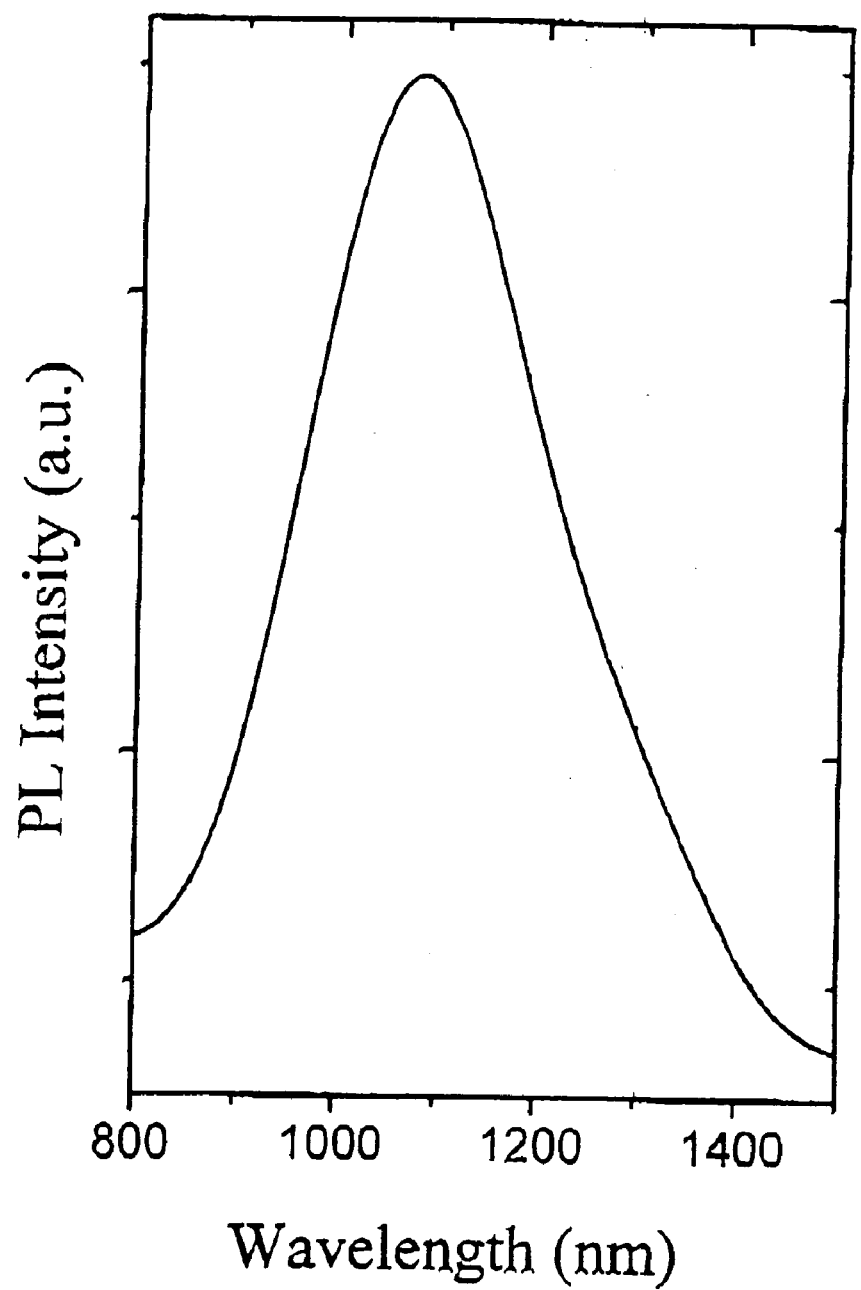
FIG. 5 shows photoluminescence spectrum of the InAs nanorods as shown in FIG. 2B.

Concerning the optical properties of the rods, the absorption spectrum exhibits a tail extending above 1 micron. FIG. 5 illustrates the photoluminescence spectrum of the InAs nanorods shown in FIG. 2B. Rods-toluene solution was measured using a He—Ne laser for excitation (632 $\mu$m). The emission was collected as a right angle configuration, dispersed by a monochromator and detected by a InGaAs PIN photodetector with lock-in amplification. As can be seen in FIG. 5, the fluorescence maximum occurs at about 1080 nm, and this corresponds well to the known position of the band gap for InAs nanodots with a diameter of about 3.5 nm, similar to the diameter of the rod. It is known that the band gap of rods is determined mostly by the diameter and hardly depends on length as has been studied for CdSe nanorods [13].

The nanocrystals obtained by the method of the invention usually have organic ligands as a coating on their outer surfaces. Such organic ligands affect the solubility of the particles and may be substituted or removed, according to the application intended for said particles. For example, when the reaction is carried out in TOPO, TOP or mixtures thereof, the nanocrystals are coated with tri-octylphosphine groups that allows them to dissolve in non-polar solvents such as toluene, hexane etc. The capping groups may be replaced by polar groups such as mercaptoacetic acid or substituted by other thio-carboxylic acids or amides, thus affording the solubility of the particles in polar solvents and even in water.

Control of rod growth is also possible through the use of other precursors. Examples for such precursors are tri-tert-butylindium (or -gallium), instead of the metal chloride precursor, or elemental As or P instead of $(TMS)_3As$ or $(TMS)_3P$.

Figure 6:
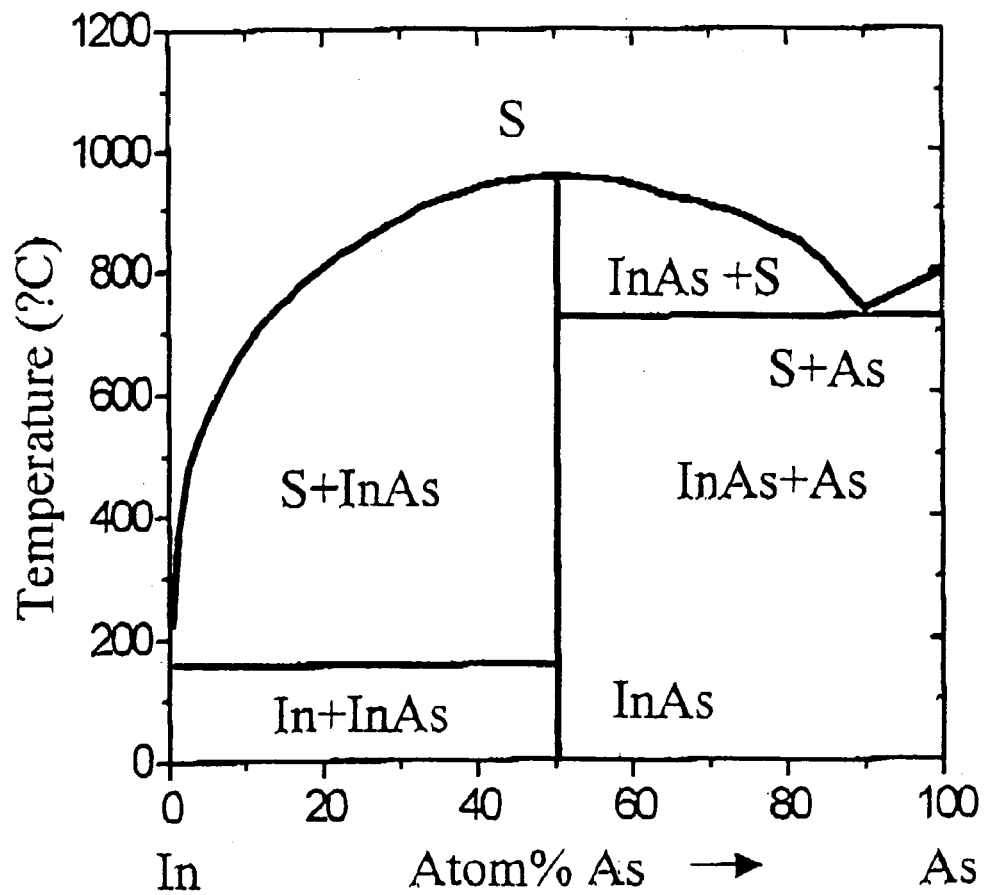
FIG. 6 illustrates In—As binary phase diagram.

Other reducing agents may also be used instead of $NaBH_4$. Use of a reducing agent that is soluble in the stock solution, would provide better control over the size and uniformity of the nanodroplets. This can be achieved by injecting the reducing agent and the precursors together, and then a higher reaction temperature can be used with TOPO or other solvents with even higher boiling points. High temperature provide improved solubility of arsenic in indium, as indicated in the In—As binary phase diagram shown in FIG. 6, as well as conditions to achieve better crystallinity and therefore improved quality of the rods. The indium-rich part shows three phases at different temperatures. At a high temperature, In—As alloy is in the melting state; at a medium temperature, rods and indium-arsenide alloy coexists; at a temperature below the melting point of indium, rod growth stops, the two solid phases, InAs and In are separated.

The method of the present invention may be easily extended to the preparation of nanorods of other inorganic semiconductors. Other Group IIIa–Va semiconductors, e.g. InP or GaAs, can be prepared using tris(trimethylsilyl) arsine/phosphine and $InCl_3$ or $GaCl_3$ as precursors. Alloy rods can also be made in a similar fashion by proper mixing of the $InCl_3$ and $GaCl_3$ precursors (or $(TMS)_3As/P$) although the alloy composition will then also be determined by the different solubility of the different precursors in the catalytic metal particle.

Use of other catalytic metal nanodroplets having higher melting point may also provide controllable nanorod growth. As an example, the preparation of CdSe nanorods is described. Gold nanoparticles were used to catalyze and direct the growth of CdSe quantum rods. Thiol stabilized spherical gold nanocrystals have the advantage of size tunability from as small as 1 nm to tens of nanometers, narrow size distribution, and solubility in multiple solvents. Considering that the melting point of nanoparticles is reduced significantly with decreased sizes, the melting point of gold nanoparticles of appropriate sizes fall into the working temperatures of the method of the present invention, thus enabling the formation of high quality quantum rods with tunable diameters and lengths. Thus, gold nanoparticles with a diameter range of 1 to 10 nm were prepared separately [22]. These nanoparticles were made soluble in nonpolar solvents such as toluene. In the synthesis, gold nanocrystals were added either in the stock solution containing the precursors, or in the growth solution, which is TOP or TOPO or their mixtures. The reactants, dimethyl cadmium ($CdMe_2$, with a concentration range of 0.05–0.5 M) and selenium, are dissolved in TOP or tributylphoshine (TBP), with a $CdMe_2$ to Se ratio in the range of 0.8:1 to 1.4:1. The ratio between $CdMe_2$ and gold, which is critical in determining the rod length, was in a range between 5:1 and 9.5:1. The reaction was conducted by injecting the stock solution into the growth solution at an elevated temperature of about 280° C., followed by annealing at a temperature of about 260° C. for a period from a few minutes to a few hours. There were obtained CdSe quantum rods. Centrifugation steps may be used to improve the length distribution. The rods have a gold nanoparticle at one end and the rod diameters can be tuned from about 1 to about 10 nm, and lengths from 10 to 500 nm.

Rod/shell nanocrystals based on InAs nanorods, e.g. InAs/ZnSe or InAs/CdSe, may be prepared to improve the photoluminescence quantum yield and to provide further control of the optical and electronic properties of the nanorods [19, 20].

The nanorods of the present invention serve as an optical medium, which when exposed to laser radiation, produces stimulated gain emission. By changing the diameter of the rod, which can easily be controlled in the technique of the present invention (i.e., by defining a desired diameter of the metallic catalyst), the absorption and emission spectrum of the medium can be appropriately adjusted: the larger the diameter of the rod, the longer the absorption and emission wavelength. These properties of the nanorods of the present invention enable their use as amplifiers, lasing medium, and NIR light detectors.

The rod/shell nanocrystals of the present invention can be used as an optical amplifier having a stable bandwidth, in wideband optical amplifiers and lasers having adjustable center-frequency and bandwidth. In order to realize a wideband optical amplifier for amplifying data-carrying optical signals propagating in a light transmitting medium (e.g., a segment of optical fiber), a pumping, coherent-light source connected to the light transmitting medium (e.g., a segment of optical fiber) is used for exciting a plurality of semiconductor core/shell nanorods with light energy required for the amplification of the data-carrying optical signals within a specific optical band. To this end, each nanorod has core dimensions that correspond to this specific optical band and is located at a predetermined point within the light transmitting medium.

In modern data communication systems, amplification of data-carrying optical signals is typically required to compensate for losses in the magnitude of the optical signals caused by the signal propagation through an optical fiber. In the optical data communication system, a wideband optical amplifier formed by the nanorods of the present invention (or a sequence of such amplifiers) is interconnected, by segments of light transmitting medium, between a modulator connected to a data-source for modulating an optical signal with data to be carried from the data-source to a destination by the optical signal, and a demodulator located at the destination for demodulating the data-carrying optical signals.

For a variety of telecommunication purposes, there is a need for materials having emittance and optical gain as well as laser action, tunable in the Near IR (NIR) spectral range. The tunability of the band gap luminescence of the InAs nanorods over the range can be achieved by varying its diameter. By applying a shell of another semiconductor, the luminescence wavelengths of nanocrystals can be modified. A laser can be achieved by uniformly dispersing a plurality of nanorods of the present invention in a laser host medium, thereby obtaining an active lasing medium, and using a pumping source for exciting each of said nanorods, and an optical cavity that provides an optical feedback mechanism for the coherent light produced by the laser active medium.

Due to the rod-like geometry of the nanocrystals of the present invention, substantially homogeneous orientation of the long axes of the nanorods can be obtained (e.g., by stretching the nanocrystal film). This property allows for using the nanorods of the present invention as an active polarizing medium in an optical device such as light emitting diode, laser, and display, to obtain a specific polarization direction of the output light.

Those skilled in the art will readily appreciate that various modifications and changes can be applied to the present invention as hereinbefore described without departing from its scope defined in and by the appended claims.

What is claimed is:

1. A method for the production of inorganic semiconductor nanocrystals having a rod-like shape, the method comprising:

reacting, in a high-boiling point organic solvent, a two-source precursor solution comprising at least one metal source and at least one nonmetal source, or a single-source precursor solution, with a metal catalyst or an agent capable of producing said metal catalyst, said high-boiling point organic solvent having a temperature above 200° C., thereby forming a reaction product comprising semiconductor nanocrystals of various shape;

cooling the reaction product, and subsequently exposing said cooled reaction product to at least one centrifugal step so as to obtain semiconductor nanocrystals having substantially rod-like shape.

2. A method according to claim 1, wherein said metal source is a Group IIIa metal compound.

3. A method according to claim 1, wherein said metal source is a Group IIb metal compound.

4. A method according to claim 1, wherein said metal source is a Group Ib metal compound.

5. A method according to claim 2, wherein said Group IIIa metal compound is a Group IIIa metal salt.

6. A method according to claim 5, wherein said Group IIIa metal salt is a Group IIIa metal halide.

7. A method according to claim 6, wherein said Group IIIa metal halide is $InCl_3$.

8. A method according to claim 1, wherein said Group Va nonmetal source is in elemental form.

9. A method according to claim 1, wherein said nonmetal source is a Group Va compound.

10. A method according to claim 9, wherein said Group Va compound is a tris(trialkylsilyl) of a Group Va element.

11. A method according to claim 10, wherein said Group Va compound is tris(trialkylsilyl)arsenine.

12. A method for the formation of Group III–V semiconductor nanocrystals having rod-like shape, comprising (i) reacting, in a high-boiling point organic solvent, a precursor solution comprising at least one Group IIIa metal source and at least one Group Va nonmetal source with a metal catalyst or an agent capable of producing said metal catalyst, said high-boiling point organic solvent having a temperature above 200° C., thereby forming a reaction product comprising Group III–V nanocrystals of various shape;

(ii) cooling the reaction product, and (iii) subsequently exposing said cooled reaction product to at least one centrifugal step so as to obtain Group III–V semiconductor nanocrystals having substantially rod-like shape.

13. A method according to claim 1, wherein said nonmetal source is a Group VIa compound.

14. A method according to claim 1, wherein said nonmetal source is a Group VIIa compound.

15. A method according to claim 1, wherein said nonmetal source is a Group VIa element.

16. A method according to claim 1, wherein said single-source precursor is selected from the group consisting of a compound comprising both Group Ib and Group VIIa elements, a compound comprising both Group IIb and Group VIa elements, a compound comprising both Group IIIa and Group Va elements, and a compound comprising a Group IVa element.

17. A method according to claim 1, wherein said agent capable of producing said metal is a reducing agent.

18. A method according to claim 17, wherein said reducing agent is selected from $NaBH_4$, $KBH_4$, and $Na_2SO_3$.

19. A method according to claim 1, wherein said metal catalyst is selected from a noble metal, a group Ib metal, a Group IIb metal, a Group IIIb metal and a transition metal.

20. A method according to claim 19, wherein said noble metal catalyst is gold.

21. A method according to claim 19, wherein said Group IIIa metal is selected from Al, Ga, and In.

22. A method according to claim 19, wherein said transition metal is selected from Fe, Zn, and Cd.

23. A method according to claim 1, wherein said high boiling point solvent is a strongly coordinating organic solvent.

24. A method according to claim 23, wherein said solvent is selected from trioctylphosphine (TOP), trioctylphosphine oxide (TOPO), triphenylphosphine (TPP), triphenylphosphine-oxide (TPPO), hexadecyl amine (HDA) and dodecylamine (DDA).

25. A method according to claim 12, wherein step (i) is carried out under a pressure higher than normal pressure.

26. A method for the formation of InAs semiconductor nanocrystals having rod-like shape, comprising introducing a precursor solution of an In source and an As source into a hot mixture comprising $NaBH_4$ and a high boiling point organic solvent, said hot mixture having a temperature above 200° C., thereby forming a reaction product comprising InAs nanocrystals of various shape, and exposing said reaction product to at least one centrifugal step so as to obtain InAs semiconductor nanocrystals having a rod-like shape.

27. Group III–V semiconductor nanocrystals having rod-like shape, produced by the method of claim 1.

28. Group III–V semiconductor nanocrystals having rod-like shape, produced by the method of claim 12.

29. InAs semiconductor nanocrystals having rod-like shape, produced by the method of claim 1.

30. InAs semiconductor nanocrystals having rod-like shape, produced by the method of claim 26.

31. Inorganic semiconductor nanocrystals having a rod-like shape, produced by the method of claim 1.

32. An optical device comprising a plurality of nanorods produced by the method of claim 1.

33. The optical device according to claim 32, operable as a wideband optical amplifier for amplifying data-carrying optical signals, the device comprising a pumping coherent-light source connected to a light transmitting medium for exciting each of said nanorods with light energy required for the amplification of data-carrying optical signals within a specific optical band received in said light transmitting medium, each of said nanorods having dimensions corresponding to said specific optical band and being located at a predetermined point within the light transmitting medium.

34. The device according to claim 32, wherein each of said nanorods is luminescent in the near infra-red spectral range.

35. The device according to claim 32, operable as a laser, comprising an active medium formed by the plurality of said nanorods uniformly dispersed in a laser host medium, a pumping source for exciting each of said nanorods, and an optical cavity providing an optical feedback mechanism for the coherent light produced by said laser active medium.

36. The device according to claim 32, wherein said nanorods have identical orientation of their long axes, the device being operable as a source of polarized light.

37. An optical device comprising a plurality of InAs semiconductor nanocrystal nanorods produced by the method of claim 26.

* * * * *